(12) United States Patent
Sung et al.

(10) Patent No.: US 11,332,839 B2
(45) Date of Patent: May 17, 2022

(54) ADVANCED ELECTRODEPOSITED COPPER FOIL AND COPPER CLAD LAMINATE USING THE SAME

(71) Applicant: CO-TECH DEVELOPMENT CORP., Yun Lin (TW)

(72) Inventors: Yun-Hsing Sung, Taoyuan (TW); Shih-Shen Lee, New Taipei (TW); Hung-Wei Hsu, Yun Lin (TW); Chun-Yu Kao, Yunlin County (TW)

(73) Assignee: CO-TECH DEVELOPMENT CORP., Yun Lin (TW)

( * ) Notice: Subject to any disclaimer, the term of this patent is extended or adjusted under 35 U.S.C. 154(b) by 86 days.

(21) Appl. No.: 16/904,578

(22) Filed: Jun. 18, 2020

(65) Prior Publication Data

US 2020/0399775 A1  Dec. 24, 2020

Related U.S. Application Data

(60) Provisional application No. 62/863,827, filed on Jun. 19, 2019.

(30) Foreign Application Priority Data

Jun. 15, 2020  (TW) .................................. 109120074

(51) Int. Cl.
| | |
|---|---|
| *B21C 37/00* | (2006.01) |
| *C25D 5/16* | (2006.01) |
| *H05K 1/03* | (2006.01) |
| *C25D 3/38* | (2006.01) |

(52) U.S. Cl.
CPC ................. *C25D 5/16* (2013.01); *C25D 3/38* (2013.01); *H05K 1/03* (2013.01); *H05K 2201/0355* (2013.01); *Y10T 428/12431* (2015.01)

(58) Field of Classification Search
None
See application file for complete search history.

(56) References Cited

U.S. PATENT DOCUMENTS

2010/0038115 A1  2/2010  Matsuda et al.

FOREIGN PATENT DOCUMENTS

| CN | 103857833 A | 6/2014 |
|---|---|---|
| CN | 104812945 A | 7/2015 |
| CN | 106687623 A | 5/2017 |
| CN | 107532322 A | 1/2018 |
| CN | 108505075 A | 9/2018 |
| JP | 07188979 A * | 7/1995 |
| JP | 7188979 A | 7/1995 |
| JP | 200173171 A | 3/2001 |
| JP | 200568512 A | 3/2005 |
| JP | 2010236058 A | 10/2010 |
| JP | 201174405 A | 4/2011 |
| JP | 2011216478 A | 10/2011 |

(Continued)

*Primary Examiner* — Seth Dumbris
(74) *Attorney, Agent, or Firm* — Li & Cai Intellectual Property Office (57) ABSTRACT

An advanced electrodeposited copper foil and a copper clad laminate using the same are provided. The advanced electrodeposited copper foil has an uneven micro-roughened surface. As observed by a scanning electron microscope operated with a +35 degree tilt and under 1,000× magnification, the uneven micro-roughened surface has a plurality of production direction stripes formed by copper crystals.

12 Claims, 9 Drawing Sheets

(56) References Cited

FOREIGN PATENT DOCUMENTS

| | | | |
|---|---|---|---|
| JP | 2011225987 A | 11/2011 | |
| JP | 2012255180 A | 12/2012 | |
| JP | 2015227502 A | 12/2015 | |
| JP | 20163378 A | 1/2016 | |
| JP | 2018141228 A | 9/2018 | |
| TW | 201317399 A1 | 5/2013 | |
| TW | 201718948 A | 6/2017 | |
| TW | M608774 U | 3/2021 | |
| WO | 2007007870 A1 | 1/2007 | |
| WO | WO2013047272 A1 | 4/2013 | |
| WO | WO-2015102323 A1 * | 7/2015 | ............... C25D 5/02 |
| WO | WO2016174998 A1 | 11/2016 | |
| WO | WO2019024974 A1 | 2/2019 | |

\* cited by examiner

ADVANCED ELECTRODEPOSITED COPPER FOIL AND COPPER CLAD LAMINATE USING THE SAME

CROSS-REFERENCE TO RELATED PATENT APPLICATION

This application claims the benefit of priority to Taiwan Patent Application No. 109120074, filed on Jun. 15, 2020. The entire content of the above identified application is incorporated herein by reference.

This application claims priority from the U.S. Provisional Patent Application Ser. No. 62/863,827 filed Jun. 19, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrodeposited copper foil, and more particularly to an advanced electrodeposited copper foil and a copper clad laminate using the same.

BACKGROUND OF THE DISCLOSURE

With the development of information and electronic industries, high frequency and high speed signal transmission has become an integral part of modern circuit design and manufacture. In order to meet the high frequency and high speed signal transmission requirements of electronic products, a copper clad laminate (CCL) needs to be capable of preventing an excessive loss of a high frequency signal so as to achieve good signal integrity (SI). In general, the insertion loss of a copper foil in the copper foil substrate is highly correlated with the surface roughness of a surface-treated surface thereof. However, the peel strength of the copper foil conflicts with signal integrity. More specifically, when the copper foil has a flatter surface profile, it would achieve better signal integrity. When the copper foil has a rougher surface profile, it would achieve better peel strength. Therefore, it is necessary to develop a copper clad laminate that can provide a balance between signal integrity and peel strength in this technical field.

SUMMARY OF THE DISCLOSURE

In response to the above-referenced technical inadequacies, the present disclosure provides an advanced electrodeposited copper foil, which can be applied to the 5G field that requires high frequency and high speed transmission and can maintain properties required for a target application, such as the peel strength of an electrodeposited copper foil. The present disclosure further provides a copper clad laminate using the advanced electrodeposited copper foil, which can serve as a high frequency and high speed transmission substrate.

In one aspect, the present disclosure provides an advanced electrodeposited copper foil that has an uneven micro-roughened surface. As observed by a scanning electron microscope operated with a +35 degree tilt and under 1,000× magnification, the micro-roughened surface has a plurality of production direction stripes and a plurality of fine strips which are formed by copper crystals, and at least five of the fine strips each have a minimum included angle that is greater than 20 degrees relative to the production direction stripes.

In another aspect, the present disclosure provides a copper clad laminate that includes a substrate and an advanced electrodeposited copper foil. The advanced electrodeposited copper foil is disposed on the substrate and has an uneven micro-roughened surface that is bonded to a surface of the substrate. As observed by a scanning electron microscope operated with a +35 degree tilt and under 1,000× magnification, the micro-roughened surface has a plurality of production direction stripes and a plurality of fine strips which are formed by copper crystals, in which at least five of the fine strips each have a minimum included angle that is greater than 20 degrees relative to the production direction stripes.

In certain embodiments, as observed by the scanning electron microscope operated with a +35 degree tilt and under 10,000× magnification, the fine strips each have a length and a width which satisfy the following relationship:

$$50 \text{ nm} \leq \text{width} \leq 1000 \text{ nm; and}$$

$$1.0 \text{ μm} \leq \text{length} \leq 10 \text{ μm}.$$

In certain embodiments, as observed by the scanning electron microscope operated with a +35 degree tilt and under 10,000× magnification, the micro-roughened surface has at least ten first smooth areas each having a length of 250 nm and a width of 250 nm and at least one second smooth area having a length of 500 nm and a width of 500 nm, and no copper crystals are present in each of the first and second smooth areas.

In certain embodiments, different quantities of the copper crystals are stacked together to form respective copper whiskers, and different quantities of the copper whiskers are grouped together to form respective copper crystal groups. As observed by the scanning electron microscope operated with a +35 degree tilt and under 10,000× magnification, the copper crystals, the copper whiskers or the copper crystal groups have a median maximum diameter less than 550 nm.

In certain embodiments, each of the copper whiskers has a topmost copper crystal that is in the shape of a conoid, a rod or a sphere.

In certain embodiments, the micro-roughened surface has a surface roughness (Rz JIS B 0601-1994) less than 2.3 μm.

In certain embodiments, as observed by the scanning electron microscope operated with a +35 degree tilt and under 10,000× magnification, the number of the fine strips is three or more.

One of the beneficial effects of the present disclosure is that, the advanced electrodeposited copper foil and the copper clad laminate can increase signal integrity and suppress insertion loss, while maintaining good peel strength, to be adaptable to high frequency and high speed signal transmission so as to meet the requirements of 5G applications, by virtue of "the micro-roughened surface has a plurality of production direction stripes and a plurality of fine strips which are formed by copper crystals, and at least five of the fine strips each have a minimum included angle greater than 20 degrees relative to the production direction stripes."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

It is worth mentioning that, the present disclosure substantially uses a technical solution that is discarded due to a technical prejudice in the art, which allows a copper foil surface to have a certain degree of unevenness. The technical solution can directly achieve the beneficial technical effect of further optimizing electrical properties on the premise of maintaining good peel strength.

Figure 1:
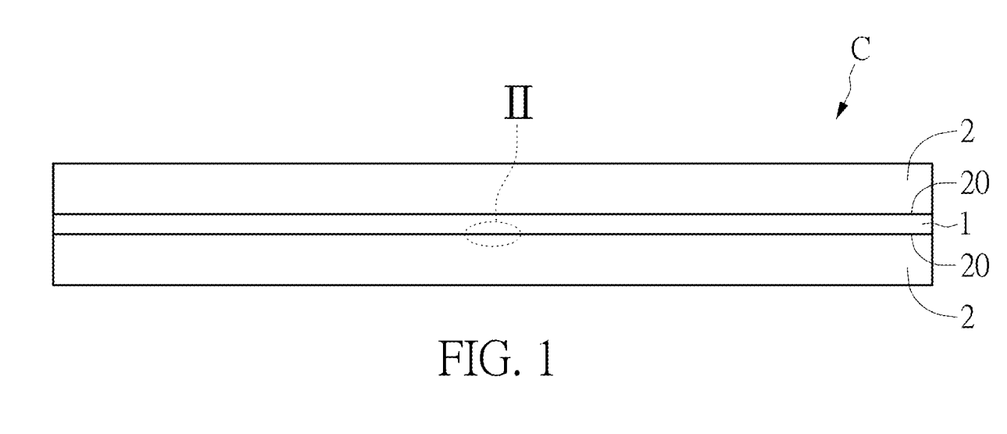
FIG. 1 is a structural schematic view of a copper clad laminate of the present disclosure.
Figure 2:
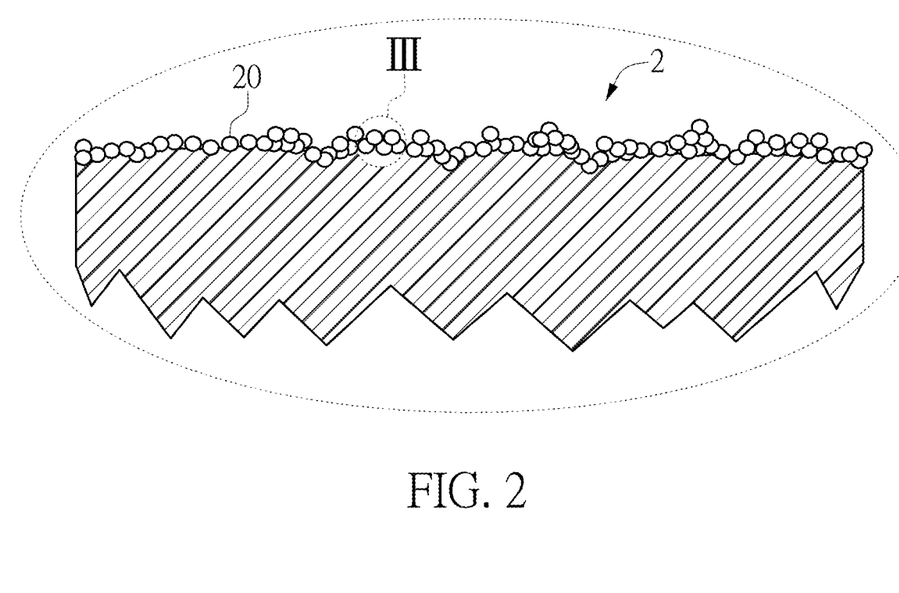
FIG. 2 is an enlarged view of section II of FIG. 1.
Figure 3:
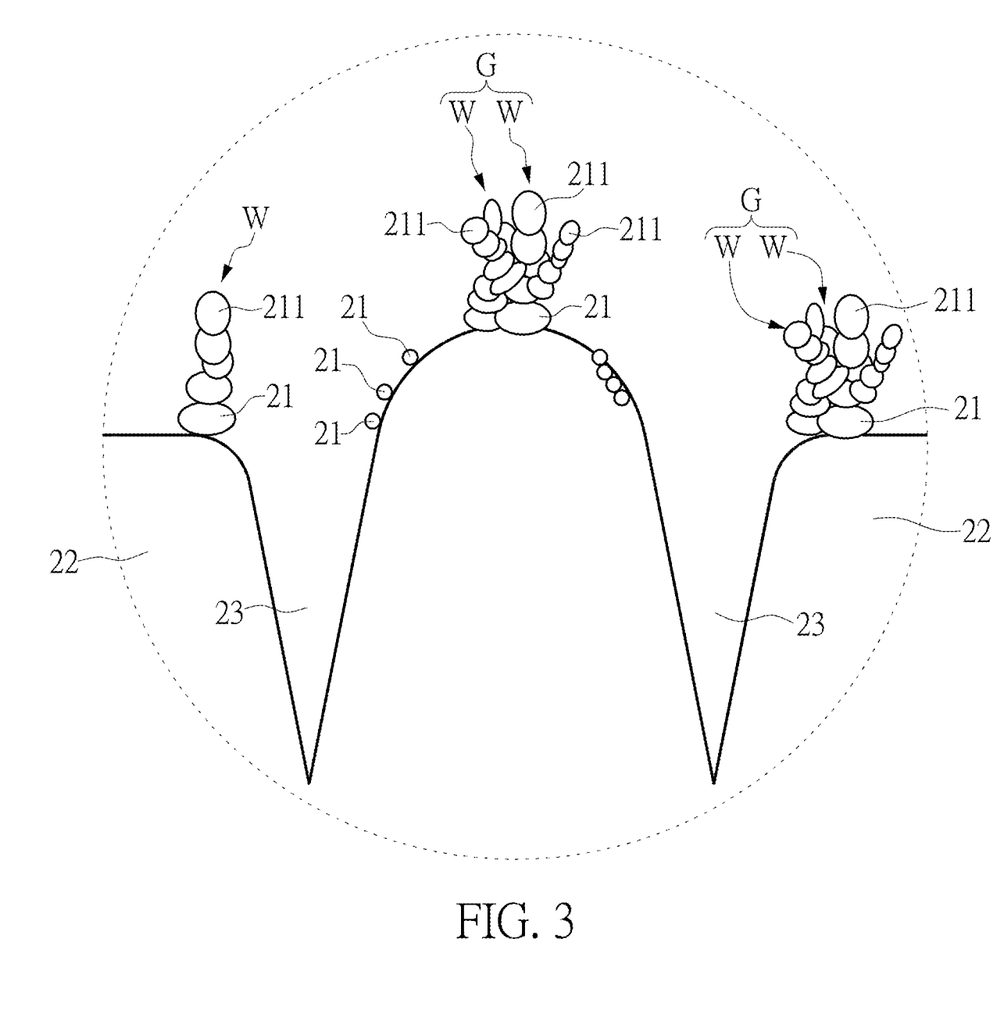
FIG. 3 is an enlarged view of section III of FIG. 2.

Referring to FIG. 1 to FIG. 3, the present disclosure provides a copper clad laminate C that includes a substrate 1 and at least one advanced electrodeposited copper foil 2 disposed on the substrate 1. In the present embodiment, the quantity of the advanced electrodeposited copper foil 2 is two, each of which has an uneven micro-roughened surface 20 that is bonded to a surface of the substrate 1, but the present disclosure is not limited thereto. In other embodiments, the copper clad laminate C can include only one advanced electrodeposited copper foil 2.

In order to reduce insertion loss, the substrate 1 can be formed from a material having a low dissipation factor (Df). The Df of the substrate 1 can be less than or equal to 0.015 at 10 GHz, preferably less than or equal to 0.010, and more preferably less than or equal to 0.005.

More specifically, the substrate 1 is formed from a resin-based composite material (i.e., a prepreg), which is obtained by the steps of impregnating a base material with a synthetic resin and then curing the impregnated base material. Specific examples of the base material include a phenolic cotton paper, a cotton paper, a fabric made of resin fibers, a non-woven fabric made of resin fibers, a glass board, a glass woven fabric and a glass non-woven fabric. Specific examples of the synthetic resin include an epoxy resin, a polyester resin, a polyimide resin, a cyanate ester resin, a bismaleimide triazine resin, a polyphenylene ether resin and a phenol resin. The synthetic resin can be formed into a single-layered or multi-layered structure. The resin-based composite material can be a mid loss, low loss, very low loss or ultra low loss material, which are well-known to people skilled in this art and are specifically exemplified by products of EM890, EM890(K), EM891(K), EM528, EM526, IT170GRA1, IT958G, IT968G, IT150DA, S7040G, S7439G, S6GX, TU863+, TU883 (A,SP), MEGTRON 4, MEGTRON 6, MEGTRON 7 and MEGTRON 8. However, these examples are not meant to limit the scope of the present disclosure.

Referring to FIG. 2 and FIG. 3, the micro-roughened surface 20 of the advanced electrodeposited copper foil 2 is formed by a micro-roughening treatment of copper electrodeposition. It is worth mentioning that, the micro-roughened surface 20 has a plurality of copper crystals 21, a plurality of copper whiskers W and a plurality of copper crystal groups G which are in a non-uniform distribution, i.e., being non-uniformly deposited on a copper foil surface. Each of the copper whiskers W is formed by two or more of the copper crystals 21 stacked together, and different quantities of the copper crystals 21 are stacked together to form the respective copper whiskers W. Furthermore, each of the copper whiskers W has a topmost copper crystal 211 that is in the shape of a conoid, a rod or a sphere, and preferably a sphere. Each of the copper crystal groups G is formed by two or more of the copper whiskers W grouped together, and different quantities of the copper whiskers W are grouped together to form the respective copper crystal groups G.

Figure 5:
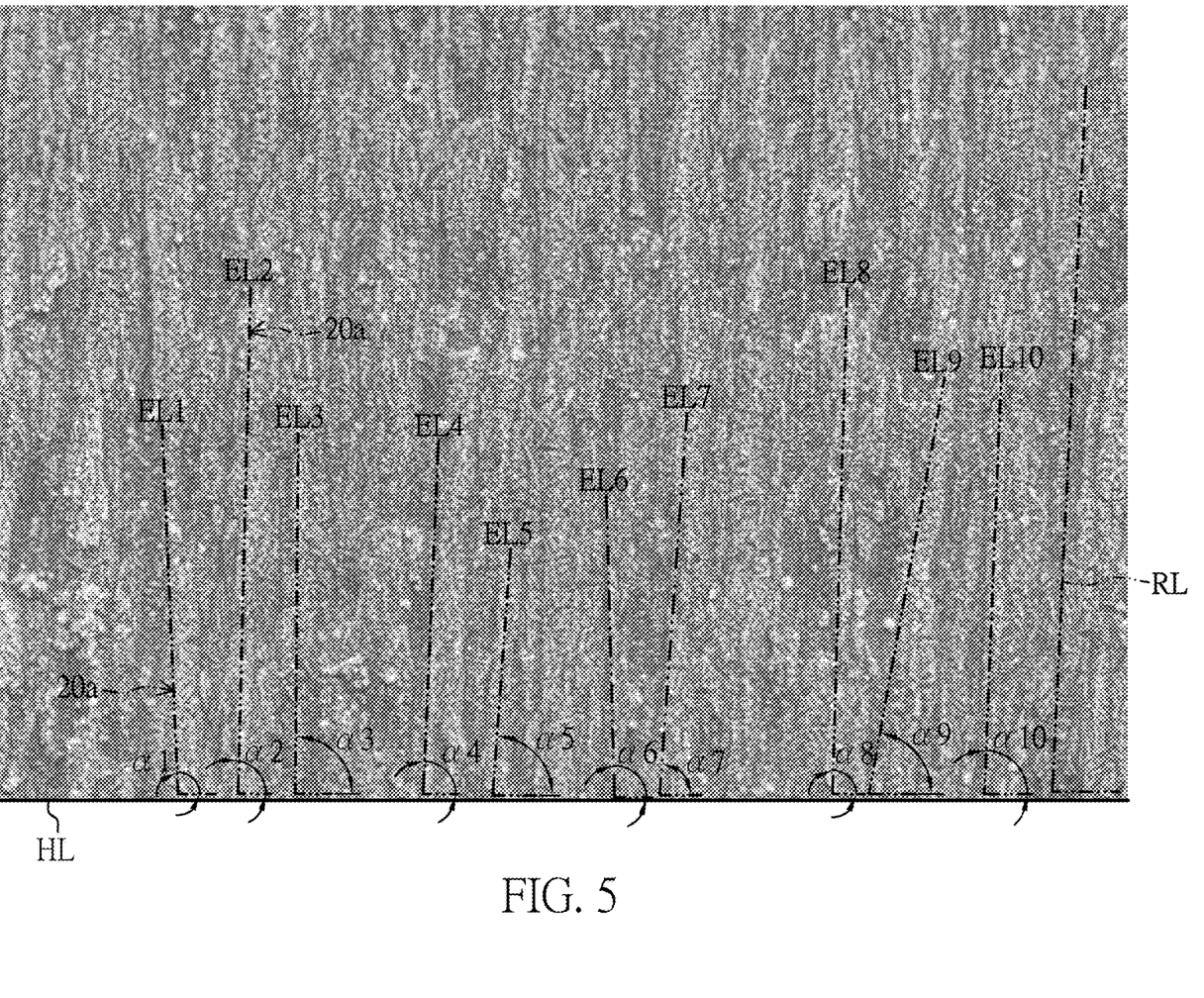
FIG. 5 is a scanning electron microscope image taken with a +35 degree tilt and under 1,000× magnification, which shows a surface profile of the advanced electrodeposited copper foil of the present disclosure.
Figure 6:
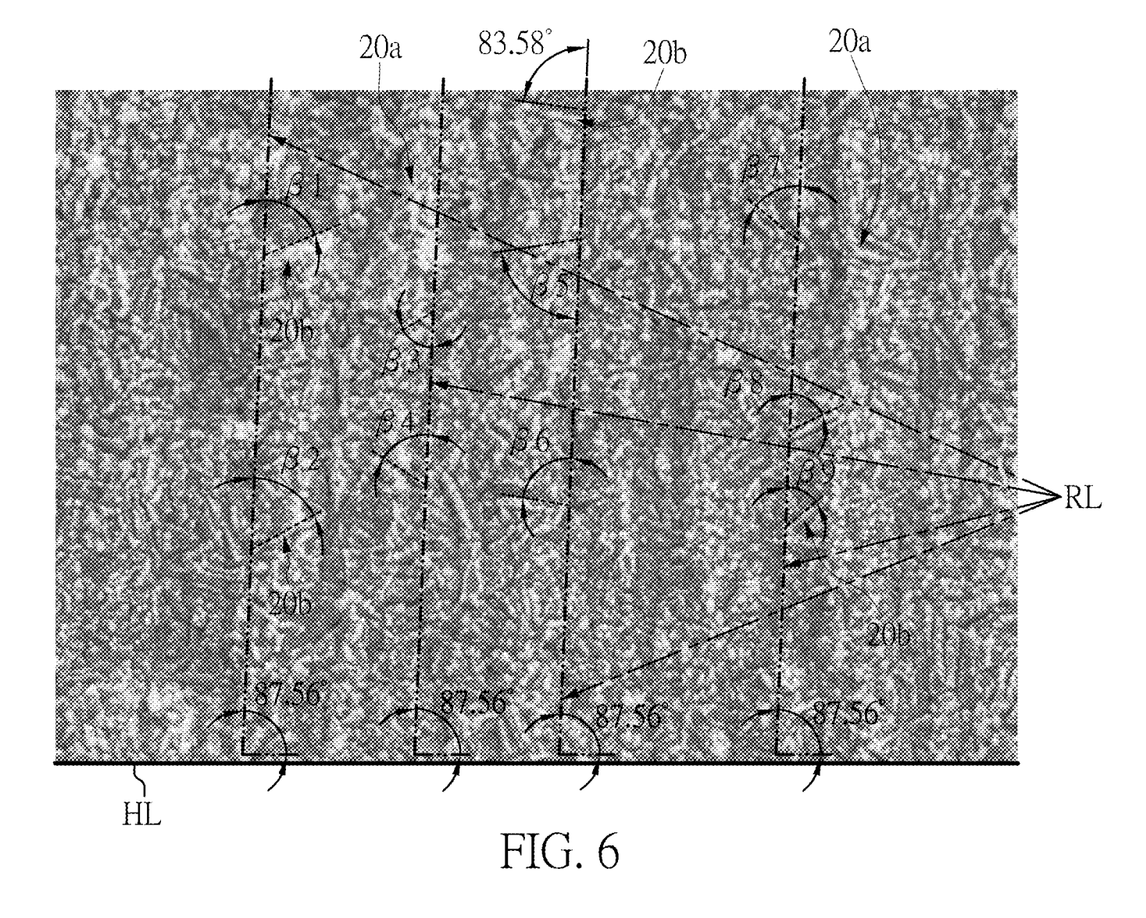
FIG. 6 is a scanning electron microscope image taken with a +35 degree tilt and under 3,000× magnification, which shows the surface profile of the advanced electrodeposited copper foil of the present disclosure.

Referring to FIG. 5 and FIG. 6, as observed by a scanning electron microscope (S-3400N, manufactured by Hitachi, Ltd.) operated at a +35 degree tilt and 3,000× magnification, the micro-roughened surface 20 has a plurality of production direction stripes 20a and a plurality of fine strips 20b. A reference line RL is defined by the production direction stripes 20a, and the fine strips 20b each have a minimum included angle β1-β9 greater than 20 degrees relative to the reference line RL.

The reference line RL is defined as follows: acquiring images of the micro-roughened surface 20 as shown in FIG. 5 and FIG. 6 by a scanning electron microscope operated at a +35 degree tilt and respectively under magnification of 1,000× and magnification of 3,000×, with a sample being placed in the production direction (MD) (i.e., the extension direction of the production direction stripes 20a); using an image analysis software (ImageJ software from the National Institutes of Health, available at on the Internet at https://imagej.nih.gov/ij/download.html) to draw a horizontal line HL at the bottom of the image under 1,000× magnification, and then draw extension lines of ten of the production direction stripes 20a at different positions; acquiring the inclination angles α1-α10 of the ten production direction stripes 20a relative to the horizontal line HL to calculate an average value; and drawing a reference line RL according to the average value of the inclination angles α1-α10 and based on the horizontal line HL. As shown in FIG. 5, the inclination angles α1-α10 of the ten production direction stripes 20a are respectively 92.79 degrees, 88.13 degrees, 89.51 degrees, 86.49 degrees, 85.74 degrees, 91.45 degrees, 85.88 degrees, 88.27 degrees, 79.62 degrees and 87.71 degrees, with the average value thereof being 87.56 degrees.

The inclination angles of the fine strips 20b are measured by the following method: using the image analysis software (ImageJ software from the National Institutes of Health, http://rsb.info.nih.gov) to draw another horizontal line HL on the image under 3,000× magnification, and then draw a number of the reference lines RL that are parallel to each other based on the another horizontal line HL; and acquiring the minimum included angles β1, β2, β3, β4, β5, β6, β7, β8, β9 of the fine strips 20b respectively relative to the reference lines RL. As shown in FIG. 6, at least five of the minimum included angles β1, β2, β3, β4, β5, β6, β7, β8, β9 of the fine strips 20b are greater than 20 degrees. As used herein, the term "fine strip" means a strip having a length and a width which satisfy the following relationship: 50 nm≤width≤1000 nm and 1.0 μm≤length≤10 μm.

Figure 7:
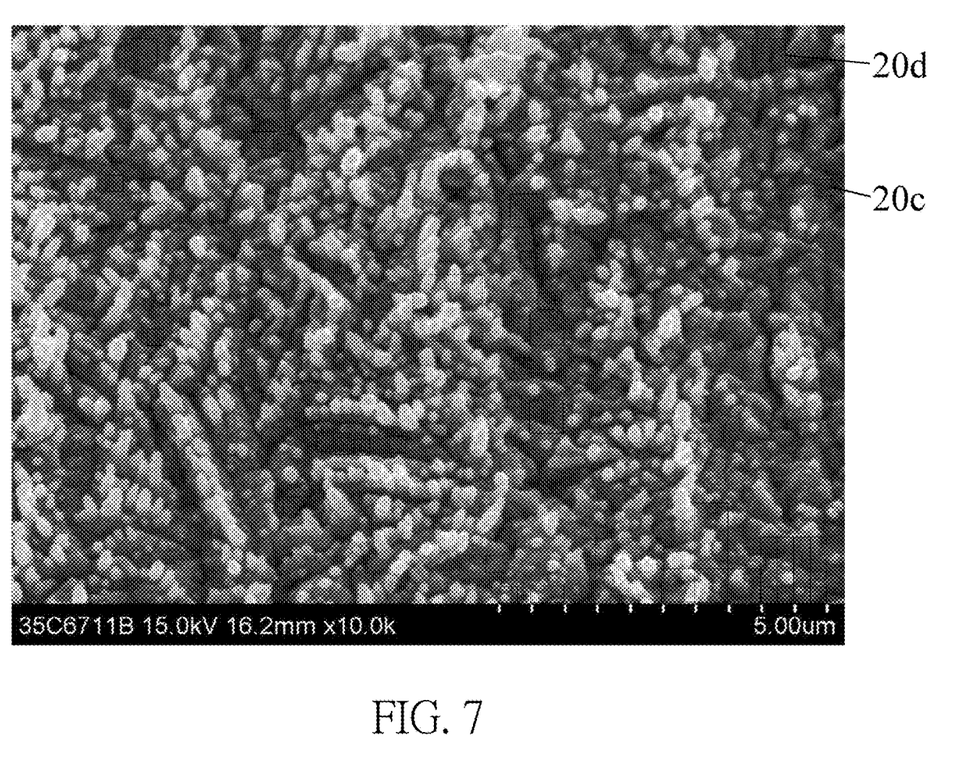
FIG. 7 is a scanning electron microscope image taken with a +35 degree tilt and under 10,000× magnification, which shows the surface profile of the advanced electrodeposited copper foil of the present disclosure.

Referring to FIG. 7, as observed by a scanning electron microscope (S-3400N, manufactured by Hitachi, Ltd.) operated at a +35 degree tilt and 10,000× magnification, the micro-roughened surface 20 further has at least ten first smooth areas 20c each having a length of 250 nm and a width of 250 nm and at least one second smooth area 20d having a length of 500 nm and a width of 500 nm, which are located between the production direction stripes 20a and the fine strips 20b.

It is worth mentioning that, different from the conventional electrodeposited copper foil, the micro-roughened surface 20 of the advanced electrodeposited copper foil 2 has a plurality of production direction stripes 20a and a plurality of fine strips 20b which are formed by copper crystals 21, in which at least five of the fine strips 20b each have a minimum included angle β1, β2, β3, β4, β5, β6, β7, β8, β9 greater than 20 degrees. Furthermore, on the micro-roughened surface 20, there are at least ten first smooth areas 20c each having a length of 250 nm and a width of 250 nm and at least one second smooth area 20d having a length of 500 nm and a width of 500 nm. Therefore, the advanced electrodeposited copper foil 2 of the present disclosure can increase signal integrity and suppress insertion loss on the premise of maintaining good peel strength, so as to be adaptable to high frequency and high speed signal transmission. In addition, the micro-roughened surface 20 has a surface roughness (Rz JIS B 0601-1994) less than 2.3 μm, which can facilitate a reduction in line width and line spacing.

Reference is again made to FIG. 3, in which the micro-roughened surface 20 further includes a plurality of peaks 22 and a plurality of grooves 23 between the peaks 22. The copper crystals 21, the copper whiskers W and the copper crystal groups G are correspondingly formed on the peaks 22. Each of the grooves 23 has a U-shaped or V-shaped cross-sectional profile. Accordingly, when the advanced electrodeposited copper foil 2 of the present disclosure is pressed on a resin-based composite material, the micro-roughened surface 20 can receive a greater amount of a resin material so as to increase the bonding strength between the copper foil and the resulting substrate.

Manufacturing Example

Figure 4:
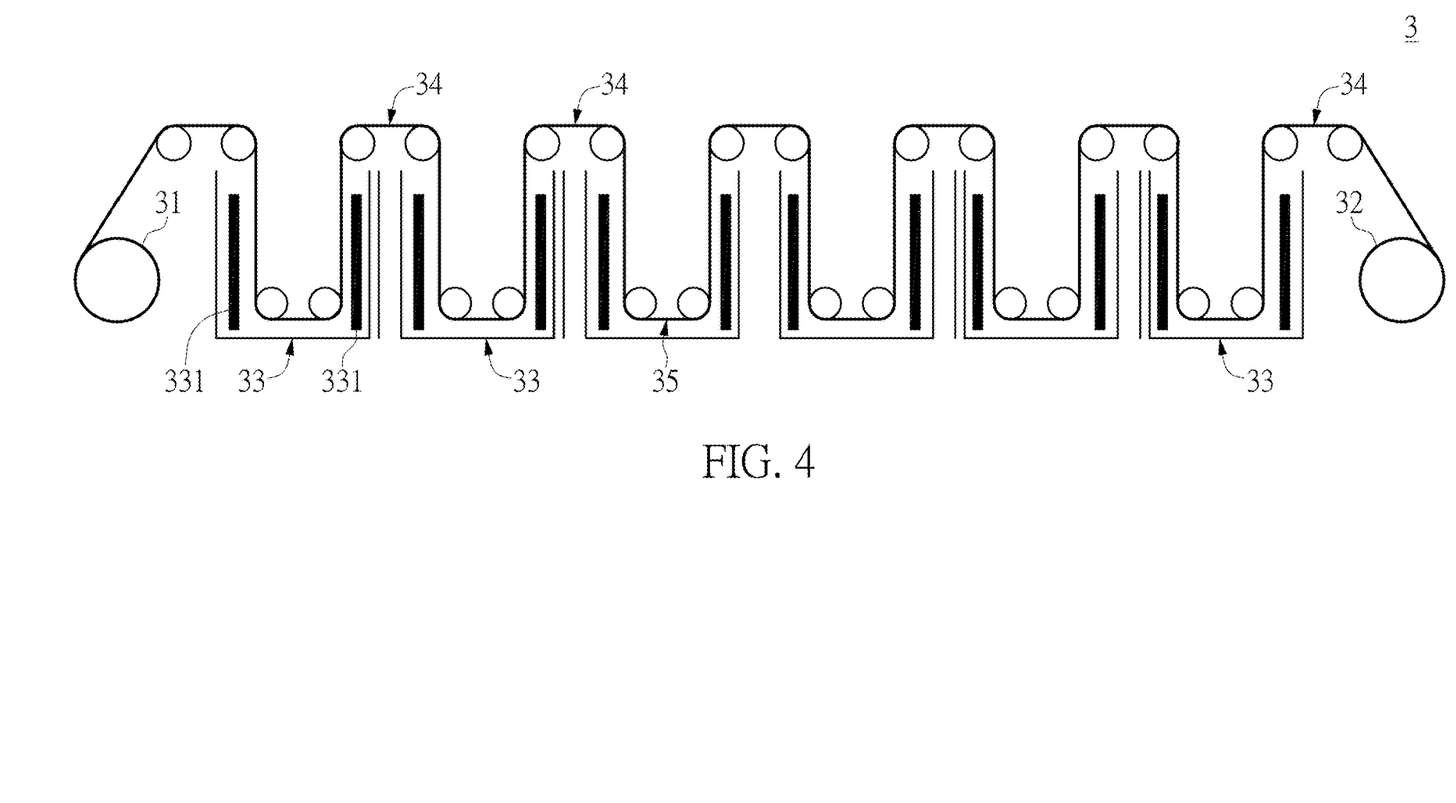
FIG. 4 is a schematic view of a continuous-type electrodepositing apparatus for producing an advanced electrodeposited copper foil of the present disclosure.

Referring again to FIG. 2, which is to be read in conjunction with FIG. 4, a method for manufacturing the advanced electrodeposited copper foil 2 of the present disclosure includes performing a micro-roughening treatment of copper electrodeposition on a matte side of a raw foil, in which the matte side is formed into a micro-roughened surface 20. The micro-roughening treatment of copper electrodeposition can be performed by a conventional apparatus, such as a continuous-type electrodepositing apparatus or a batch-type electrodepositing apparatus, with a production speed between 5 m/min and 20 m/min, a production temperature between 20° C. and 60° C., and a predetermined current density. It is worth mentioning that, a steel brush can be used to scratch the matte side of the raw foil in advance to form non-directional grooves that form a stripe pattern, but the present disclosure is not limited thereto. In certain embodiments, the micro-roughening treatment of copper electrodeposition can also be performed on a shiny side of the raw foil to allow it to be formed into a micro-roughened surface 20.

As shown in FIG. 4, a continuous-type electrodepositing apparatus 3 is used in the manufacturing example, and includes a feeding roller 31, a receiving roller 32, a plurality of electrolysis tanks 33, a plurality of electrolyzing roller assemblies 34 and a plurality of auxiliary roller assemblies 35. The electrolysis tanks 33 are arranged between the feeding roller 31 and the receiving roller 32 to contain copper-containing plating solutions having the same or different compositions. Each of the electrolysis tanks 33 has a pair of electrodes 331 (such as platinum electrodes) arranged therein. The electrolyzing roller assemblies 34 are arranged above the electrolysis tanks 33, respectively. The auxiliary roller assemblies 35 are arranged in the electrolysis tanks 33, respectively. The electrolyzing roller assemblies 34 and the auxiliary roller assemblies 35 can drive a raw foil to sequentially pass through the plating solutions within the electrolysis tanks 33 at a certain speed. The electrodes 331 of each of the electrolysis tanks 33 and the corresponding electrolyzing roller assembly 34 are jointly and electrically connected to an external power source (not shown) for electrolyzing the corresponding plating solution, so as to allow the copper foil to have a desired effect.

In practice, the copper-containing plating solutions each contain copper ions, an acid and at least one metal additive. The source of the copper ions can be copper sulfate, copper nitrate or a combination thereof. Specific examples of the acid include sulfuric acid, nitric acid or a combination thereof. Specific examples of the at least one metal additive include cobalt, iron, zinc, or a combination thereof. According to requirements, the copper-containing plating solutions can each contain at least one conventional additive such as a gelatin, an organic nitride, a hydroxyethyl cellulose (HEC), a polyethylene glycol (PEG), a sodium 3-mercaptopropane sulphonate (MPS), a bis-(sodium sulfopropyl)-disulfide (SPS), and a thiourea group-containing compound. However, the above-recited examples are merely exemplary and are not intended to limit the scope of the present disclosure.

The power supplied to the micro-roughening treatment of copper electrodeposition may be in a constant current form, a constant voltage form, a pulse wave form or a saw wave form, but it is not limited thereto. The conditions of the micro-roughening treatment of copper electrodeposition are as shown in Table 1.

It is worth mentioning that, the above-mentioned micro-roughening treatment of copper electrodeposition can be used to produce not only a reverse treated copper foil, but also a high temperature elongation (HTE) copper foil or a very low profile (VLP) copper foil.

Performance Verification of Copper Foil

An advanced electrodeposited copper foil is obtained by a micro-roughening treatment of copper electrodeposition with seven stages, and the processing conditions for each stage are shown in Table 1. A scanning electron microscope (SEM) (S-3400N, manufactured by Hitachi, Ltd.) is operated at a +35 degree tilt to obtain images (i.e., FIG. 5, FIG. 6 and FIG. 7), each showing a surface profile of the advanced electrodeposited copper foil. FIG. 5 is a SEM image with 1,000× magnification, FIG. 6 is a SEM image with 3,000× magnification, and FIG. 7 is a SEM image with 10,000× magnification.

TABLE 1

|  |  | First plating stage | Second plating stage | Third plating stage | Fourth plating stage | Fifth plating stage | Sixth plating stage | Seventh plating stage | First trace metal plating stage | Second trace metal plating stage | Third trace metal plating stage | Silane treatment |
|---|---|---|---|---|---|---|---|---|---|---|---|---|
| Conditions of plating solution | Metal ions | $Cu^{+2}$ | $Cu^{+2}$ | $Cu^{+2}$ | $Cu^{+2}$ | $Cu^{+2}$ | $Cu^{+2}$ | $Cu^{+2}$ | $Ni^{+2}$ | $Zn^{+2}$ | $Cr^{+6}$ | N/A |
|  | Metal concentration (g/L) | 5.0-10 | 66-80 | 66-80 | 5.0-10 | 5.0-10 | 66-80 | 66-80 | 17-20 | 2-4 | 1-3 | N/A |
|  | Chlorine (ppm) | <3 | <3 | <3 | <3 | <3 | <3 | <3 | <3 | <3 | <3 | <3 |
|  | Acid concentration (g/L) | Sulfuric acid 90-100 | Sulfuric acid 60-75 | Sulfuric acid 60-75 | Sulfuric acid 90-100 | Sulfuric acid 90-100 | Sulfuric acid 60-75 | Sulfuric acid 60-75 | Phosphoric acid 3-6 | Boric acid 10-25 | Phosphoric acid 0.1-2.0 | N/A |
|  | Trace metal (Ni, Pd, Ag, W . . . ) (ppm or mg/L) | 180-220 | 30-40 | 30-40 | 180-220 | 180-220 | 30-40 | 30-40 | 100-200 | 100-200 | 100-200 | N/A |
|  | Time (Sec) | 1.69 | 2.06 | 2.06 | 1.69 | 1.69 | 2.06 | 2.06 | 2.25 | 2.06 | 2.25 | 3 |
|  | Temperature (° C.)(±5° C.) | 30 | 45 | 45 | 30 | 30 | 45 | 45 | 28 | 30 | 40 | 40 |
|  | pH | <1.5 | <1.5 | <1.5 | <1.5 | <1.5 | <1.5 | <1.5 | 3-4 | 4-5 | 3-4 | 5-7 |
| Example 1 | Current density ($A/dm^2$)(±10%) | 0.01 | 13.37 | 13.37 | 21.24 | 21.24 | 4.01 | 0.01 | 1.1 | 0.6 | 0.6 | N/A |
| Example 2 | Current density ($A/dm^2$)(±10%) | 0.01 | 15.00 | 15.00 | 16.00 | 16.00 | 4.01 | 0.01 | 1.1 | 0.6 | 0.6 | N/A |

It can be observed from FIG. 5 and FIG. 6 that, in the advanced electrodeposited copper foil of the present disclosure, the copper crystals 21, the copper whiskers W and the copper crystal groups G form into an uneven (non-uniformly distributed) stripe pattern. Furthermore, more than five of the fine strips 20b each have a minimum included angle β1-β9 greater than 20 degrees relative to the reference line RL, as shown in FIG. 6. In addition, it can be observed from FIG. 7 that, in the surface profile of the advanced electrodeposited copper foil of the present disclosure, there are at least ten first smooth areas 20c each having a length of 250 nm and a width of 250 nm and at least one second smooth area 20d having a length of 500 nm and a width of 500 nm.

Different types of prepregs are used with the advanced electrodeposited copper foils of the present disclosure to produce respective copper clad laminates, which are tested for insertion loss value. The results are shown in Table 2.

TABLE 2

| Prepreg | | Delta-L test method | PCIe-PCB material and loss target (with reference to the target set by Intel) | | | |
|---|---|---|---|---|---|---|
| Type | Df | (Intel) Electrical property item | Insertion loss at 4 GHz (dB/in) | Insertion loss at 8 GHz (dB/in) | Insertion loss at 12.89 GHz (dB/in) | Insertion loss at 16 GHz (dB/in) |
| Mid loss | 0.015->0.010 | Stripline | −0.65 | −1.16 | −1.74 | −2.30 |
| Low loss | 0.010->0.005 | Stripline | −0.50 | −0.85 | −1.25 | −1.49 |
| Ultra low loss | 0.005->0.001 | Stripline | −0.35 | −0.58 | −0.83 | −0.96 |

Test Example 11

Figure 8:
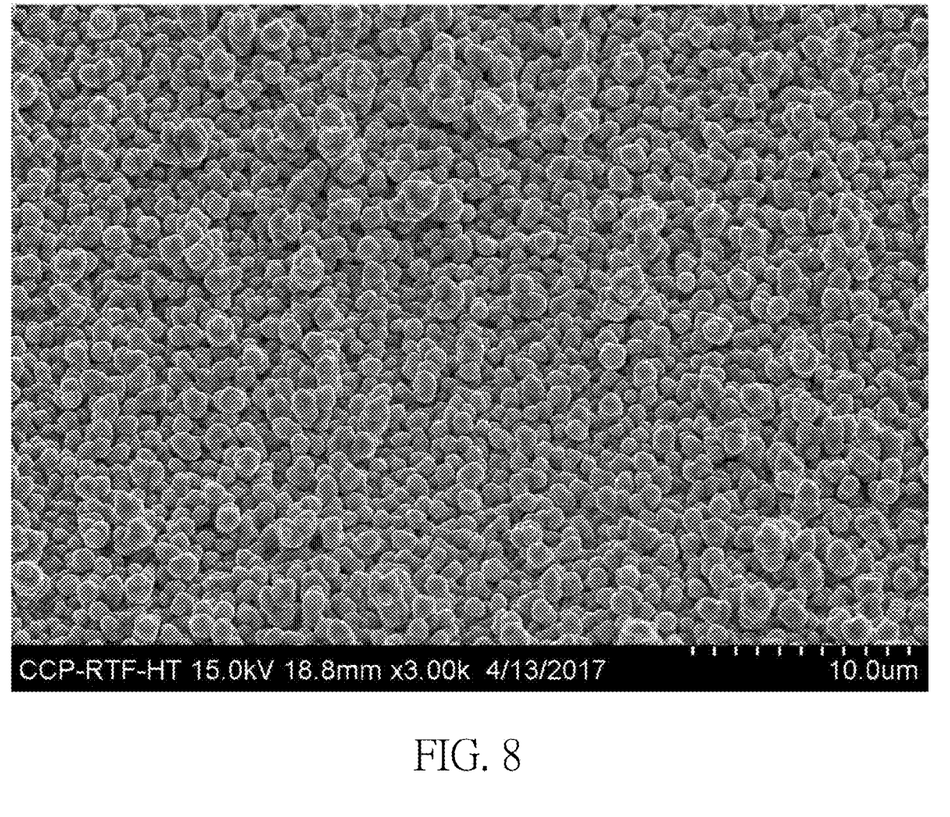
FIG. 8 is a scanning electron microscope image taken with a +35 degree tilt and under 1,000× magnification, which shows a surface profile of a conventional RTF-3 copper foil that has no fine strips.

Each of advanced electrodeposited copper foils of Examples 3-1 and 3-2 that are produced by the conditions of Example 1 as shown in Table 1, an electrodeposited copper foil according to Taiwan Patent Application No. 107133827 (product name: RG311, herein after referred to as "RG311") and an electrodeposited copper foil produced by the C company (product name: RTF-3, herein after referred to as "RTF-3") is laminated with a mid loss prepreg (product name: IT170GRA1) produced by the I company, so as to form a single-layered copper clad laminate after being cured, respectively. The RG311 has a surface roughness (Rz JIS B 0601-1994) that is less than 2.3 μm. The RTF-3 has a plurality of copper crystals that are apparently present in a uniform distribution on a copper foil surface thereof, as observed from an image obtained by a scanning electron microscope (S-3400N, manufactured by Hitachi, Ltd.) with a +35 degree tilt and under 10,000× magnification (as shown in FIG. 8). The peel strengths of the single-layered copper clad laminates all meet the practical requirements. The single-layered copper clad laminates are tested for signal integrity by the Delta-L test method provided by the Intel Corporation, and test conditions include a core thickness of 3 mils core (1 oz), 10 mils PP and 4.5 mils trace width. The results are shown in Table 3.

advanced electrodeposited copper foil is 21.32% to 25.51% less than that of the RTF-3 and is 6.01% to 10.21% less than that of the RG311. Therefore, compared to the RTF-3 and the RG311, the advanced electrodeposited copper foil has better signal integrity.

Test Example 2

Each of advanced electrodeposited copper foils of Examples 4-1 and 4-2 that are produced by the conditions of Example 1 as shown in Table 1, an electrodeposited copper foil according to Taiwan Patent Application No. 107133827 (product name: RG311, herein after referred to as "RG311") and an electrodeposited copper foil produced by the C company (product name: RTF-3, herein after referred to as "RTF-3") is laminated with a mid loss prepreg (product name: IT985G) produced by the I company, so as to form a single-layered copper clad laminate after being cured, respectively. The RG311 has a surface roughness (Rz JIS B 0601-1994) that is less than 2.3 μm. The RTF-3 has a plurality of copper crystals that are apparently present in a non-uniform distribution on a copper foil surface thereof, as observed from an image obtained by a scanning electron microscope (S-3400N, manufactured by Hitachi, Ltd.) with a +35 degree tilt and under 10,000× magnification (as shown in FIG. 8). The peel strengths of the single-layered copper

TABLE 3

| Material | Df level | Dk @ 10 GHz RC 50% | Df @ 10 GHz RC 50% | Copper foil level | Copper model | SL Loss (dB/in) 8 GHz | SL Loss (dB/in) 16 GHz | Increase compared to Comparative Example 1 8 GHz | Increase compared to Comparative Example 1 16 GHz |
|---|---|---|---|---|---|---|---|---|---|
| IT-170GRA1 | Mid Loss | 3.90 | 0.0100 | Comparative Example 1 | RTF-3 | −0.9395 | −1.7694 | 0.00% | 0.00% |
| | | | | Comparative Example 2 | RG311 | −0.8321 | −1.4986 | 11.43% | 15.30% |
| | | | | Example 1 | Advanced electrodeposited copper foil | −0.7739 | −1.3922 | 17.63% | 21.32% |
| | | | | Example 2 | Advanced electrodeposited copper foil | −0.7318 | −1.3180 | 22.10% | 25.51% |

It can be seen from the test results shown in Table 3 that, at a frequency of 8 GHz, the insertion loss of the advanced electrodeposited copper foil is 17.63% to 22.1% less than that of the RTF-3 and is 6.2% to 10.67% less than that of the RG311. At a frequency of 16 GHz, the insertion loss of the clad laminates all meet the practical requirements. The single-layered copper clad laminates are tested for signal integrity by the Delta-L test method provided by the Intel Corporation, and which test conditions include a core thickness of 3 mils core (1 oz), 10 mils PP and 4.5 mils trace width. The results are shown in Table 4.

TABLE 4

| Material | Df level | Dk @ 10 GHz RC 50% | Df @ 10 GHz RC 50% | Copper foil level | Copper model | SL Loss (dB/in) 8 GHz | SL Loss (dB/in) 16 GHz | Increase compared to Comparative Example 1 8 GHz | Increase compared to Comparative Example 1 16 GHz |
|---|---|---|---|---|---|---|---|---|---|
| IT-958G | Low Loss | 3.70 | 0.0070 | Comparative Example 1 | RTF-3 | −0.7906 | −1.4491 | 0.00% | 0.00% |
| | | | | Comparative Example 2 | RG311 | −0.6996 | −1.2415 | 11.52% | 14.33% |
| | | | | Example 1 | Advanced electrodeposited copper foil | −0.6457 | −1.1438 | 18.33% | 21.07% |
| | | | | Example 2 | Advanced electrodeposited copper foil | −0.6083 | −1.0863 | 23.06% | 25.04% |

It can be seen from the test results shown in Table 4 that, at a frequency of 8 GHz, the insertion loss of the advanced electrodeposited copper foil is 18.33% to 23.06% less than that of the RTF-3 and is about 18.33% less than that of the RG311. At a frequency of 16 GHz, the insertion loss of the advanced electrodeposited copper foil is about 21.07% less than that of the RTF-3 and the RG311, the advanced electrodeposited copper foil has better signal integrity.

Test Example 3

Figure 9:
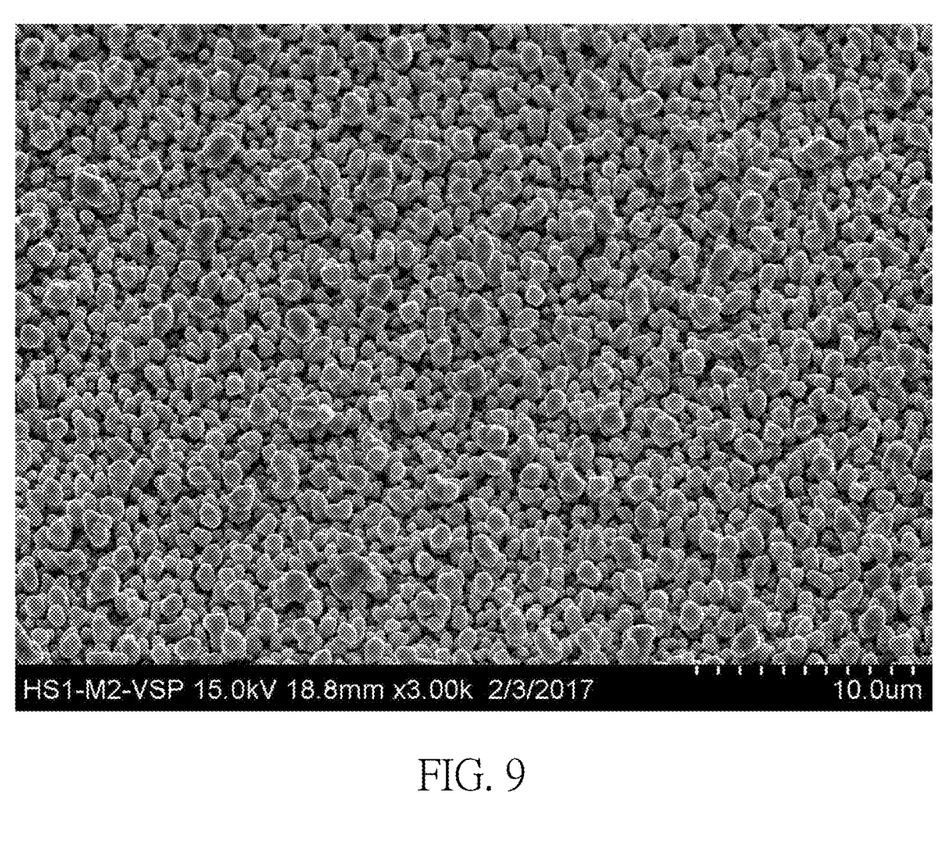
FIG. 9 is a scanning electron microscope image taken with a +35 degree tilt and under 1,000× magnification, which shows a surface profile of a conventional HS1-M2-VSP copper foil that has no production direction stripes and fine strips.

Each of advanced electrodeposited copper foils of Examples 5-1 and 5-2 that are produced by the conditions of Example 1 as shown in Table 1, an electrodeposited copper foil according to Taiwan Patent Application No. 107133827 (product name: RG311, herein after referred to as "RG311") and an electrodeposited copper foil produced by the M company (product name: HS1-M2-VSP, herein after referred to as "HS1-M2-VSP", as shown in FIG. 9) is laminated with an ultra low loss prepreg (product name: IT968) produced by the I company, so as to form a single-layered copper clad laminate after being cured, respectively. The RG311 has a surface roughness (Rz JIS B 0601-1994) that is less than 2.3 μm. The peel strengths of the single-layered copper clad laminates all meet the practical requirements of use. The single-layered copper clad laminates are tested for signal integrity by the Delta-L test method provided by the Intel Corporation, and test conditions include a core thickness of 3 mils core (1 oz), 10 mils PP and 4.5 mils trace width. The results are shown in Table 5.

It can be seen from the test results shown in Table 5 that, at a frequency of 8 GHz, the insertion loss of the advanced electrodeposited copper foil is 16.04% to 19.73% less than that of the HS1-M2-VSP and is 7.31% to 11.00% less than that of the RG311. At a frequency of 16 GHz, the insertion loss of the advanced electrodeposited copper foil is 18.62% to 23.09% less than that of the HS1-M2-VSP and is 7.12% to 11.59% less than that of the RG311. Therefore, compared to the HS1-M2-VSP and the RG311, the advanced electrodeposited copper foil has better signal integrity.

One of the beneficial effects of the present disclosure is that, the advanced electrodeposited copper foil and the copper clad laminate can increase signal integrity and suppress insertion loss, while maintaining good peel strength, to be adaptable to high frequency and high speed signal transmission so as to meet the requirements of 5G applications, by virtue of "the micro-roughened surface has a plurality of production direction stripes and a plurality of fine strips which are formed by copper crystals, and at least five of the fine strips each have a minimum included angle greater than 20 degrees relative to the production direction stripes." It should be noted that, the advanced electrodeposited copper foil is not limited to a reverse-treated electrodeposited copper foil, and can be applied to a copper foil having a surface roughness (Rz JIS B 0601-1994) less than 2.3 μm.

More specifically, different from the conventional electrodeposited copper foil, the advanced electrodeposited copper foil has a plurality of copper crystals that are present in a non-uniform distribution on a micro-roughened surface

TABLE 5

| Material | Df level | Dk @ 10 GHz RC 50% | Df @ 10 GHz RC 50% | Copper foil level | Copper model | SL Loss (dB/in) 8 GHz | SL Loss (dB/in) 16 GHz | Increase compared to Comparative Example 1 8 GHz | Increase compared to Comparative Example 1 16 GHz |
|---|---|---|---|---|---|---|---|---|---|
| IT-968 | Ultra Low | 3.66 | 0.0050 | Comparative Example 1 | HS1-M2-VSP | −0.6013 | −1.0403 | 0.00% | 0.00% |
| | | | | Comparative Example 2 | RG311 | −0.5489 | −0.9208 | 8.73% | 11.49% |
| | | | | Example 1 | Advanced electrodeposited copper foil | −0.5049 | −0.8467 | 16.04% | 18.62% |
| | | | | Example 2 | Advanced electrodeposited copper foil | −0.4827 | −0.8002 | 19.73% | 23.09% | thereof, and the copper crystals are stacked or arranged into different types of copper whiskers and copper crystal groups. Furthermore, the copper whiskers and the copper crystal groups have no special directionality, as observed from a scanning electron microscope image of the micro-roughened surface taken with a +35 degree tilt and under 10,000× magnification. The copper crystals form into a stripe pattern, in which at least five of the fine strips each have a minimum included angle greater than 20 degrees, as observed from a scanning electron microscope image of the micro-roughened surface taken with a +35 degree tilt and under 1,000× magnification. As proved by the tests, the advanced electrodeposited copper foil of the present disclosure has better signal integrity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An advanced electrodeposited copper foil having an uneven micro-roughened surface, characterized in that the micro-roughened surface has a plurality of production direction stripes and a plurality of fine strips which are formed by copper crystals, as observed by a scanning electron microscope operated with a +35 degree tilt and under 1,000× magnification, and at least five of the fine strips each have a minimum included angle that is greater than 20 degrees relative to the production direction stripes.

2. The advanced electrodeposited copper foil according to claim 1, wherein as observed by the scanning electron microscope operated with a +35 degree tilt and under 10,000× magnification, the fine strips each have a length and a width which satisfy the following relationship:

50 nm≤width≤1000 nm; and 1.0 μm≤length≤10 μm.

3. The advanced electrodeposited copper foil according to claim 1, wherein as observed by the scanning electron microscope operated with a +35 degree tilt and under 10,000× magnification, the micro-roughened surface has at least ten first smooth areas each having a length of 250 nm and a width of 250 nm and at least one second smooth area having a length of 500 nm and a width of 500 nm, and no copper crystals are present in each of the first and second smooth areas.

4. The advanced electrodeposited copper foil according to claim 1, wherein different quantities of the copper crystals are stacked together to form respective copper whiskers, and different quantities of the copper whiskers are grouped together to form respective copper crystal groups; wherein as observed by the scanning electron microscope operated with a +35 degree tilt and under 10,000× magnification, the copper crystals, the copper whiskers or the copper crystal groups have a median maximum diameter less than 550 nm.

5. The advanced electrodeposited copper foil according to claim 4, wherein each of the copper whiskers has a topmost copper crystal that is in the shape of a conoid, a rod or a sphere.

6. The advanced electrodeposited copper foil according to claim 1, wherein the micro-roughened surface has a surface roughness (Rz JIS B 0601-1994) less than 2.3 μm.

7. A copper clad laminate, comprising:
   a substrate; and
   an advanced electrodeposited copper foil disposed on the substrate and having an uneven micro-roughened surface that is bonded to a surface of the substrate, wherein the micro-roughened surface has a plurality of production direction stripes and a plurality of fine strips which are formed by copper crystals, as observed by a scanning electron microscope operated with a +35 degree tilt and under 1,000× magnification, and at least five of the fine strips each have a minimum included angle that is greater than 20 degrees relative to the production direction stripes.

8. The copper clad laminate according to claim 7, wherein as observed by the scanning electron microscope operated with a +35 degree tilt and under 10,000× magnification, the fine strips each have a length and a width which satisfy the following relationship:

50 nm≤width≤1000 nm; and 1.0 μm≤length≤10 μm.

9. The copper clad laminate according to claim 7, wherein as observed by the scanning electron microscope operated with a +35 degree tilt and under 10,000× magnification, the micro-roughened surface has at least ten first smooth areas each having a length of 250 nm and a width of 250 nm and at least one second smooth area having a length of 500 nm and a width of 500 nm, and no copper crystals are present in each of the first and second smooth areas.

10. The copper clad laminate according to claim 7, wherein different quantities of the copper crystals are stacked together to form respective copper whiskers, and different quantities of the copper whiskers are grouped together to form respective copper crystal groups; wherein as observed by the scanning electron microscope operated with a +35 degree tilt and under 10,000× magnification, the copper crystals, the copper whiskers or the copper crystal groups have a median maximum diameter less than 550 nm.

11. The copper clad laminate according to claim 10, wherein each of the copper whiskers has a topmost copper crystal that is in the shape of a conoid, a rod or a sphere.

12. The copper clad laminate according to claim 7, wherein the micro-roughened surface has a surface roughness (Rz JIS B 0601-1994) less than 2.3 μm.

* * * * *